US005593923A

United States Patent [19]
Horiuchi et al.

[11] Patent Number: 5,593,923
[45] Date of Patent: Jan. 14, 1997

[54] METHOD OF FABRICATING SEMICONDUCTOR DEVICE HAVING REFRACTORY METAL SILICIDE LAYER ON IMPURITY REGION USING DAMAGE IMPLANT AND SINGLE STEP ANNEAL

[75] Inventors: Tadahiko Horiuchi; Takashi Ishigami; Hiroyuki Nakamura; Tohru Mogami; Hitoshi Wakabayashi; Takemitsu Kunio; Koichiro Okumura, all of Tokyo, Japan

[73] Assignee: NEC Corporation, Tokyo, Japan

[21] Appl. No.: 454,735

[22] Filed: May 31, 1995

[30] Foreign Application Priority Data

Dec. 6, 1994 [JP] Japan ................................. 6-301947

[51] Int. Cl.⁶ ................................................. H01L 21/28
[52] U.S. Cl. ................................ 437/200; 437/24; 437/41
[58] Field of Search ........................ 452/24, 41, 46, 452/200, 201

[56] References Cited

U.S. PATENT DOCUMENTS

| | | | |
|---|---|---|---|
| 4,822,753 | 4/1989 | Pintchovski et al. | 437/190 |
| 4,975,385 | 12/1990 | Beinglass et al. | 437/41 |
| 5,102,826 | 4/1992 | Oshima et al. | 437/200 |
| 5,286,678 | 2/1994 | Rastogi | 437/200 |
| 5,366,928 | 11/1994 | Wolters et al. | 437/200 |
| 5,397,744 | 3/1995 | Sumi et al. | 437/200 |

FOREIGN PATENT DOCUMENTS

| | | |
|---|---|---|
| 0392725 | 10/1990 | European Pat. Off. |
| 57-99775 | 6/1982 | Japan. |
| 05036632 | 2/1993 | Japan. |

OTHER PUBLICATIONS

S. Wolf, "Silicon Processing For the VLSI Era, vol. 1", Lattice Press, 1986, pp. 290, 295–301.
"Handotai Kenkyu 24", ed. by J. Nishizawa and H. Shinkokai, Kogyo Chosakai (1986), pp. 207–239.

Primary Examiner—John Niebling
Assistant Examiner—Thomas G. Bilodeau
Attorney, Agent, or Firm—Whitham, Curtis, Whitham & McGinn

[57] ABSTRACT

A method of producing a semiconductor device having a refractory metal silicide film includes the steps of implanting ions such as silicon into an active region such as drain/source region to form a damage portion therein, depositing a refractory metal on the damage portion, and annealing to form the refractory metal silicide layer. This silicide layer is formed by the refractory metal being reacted with silicon in the damage portion of the active region.

20 Claims, 10 Drawing Sheets

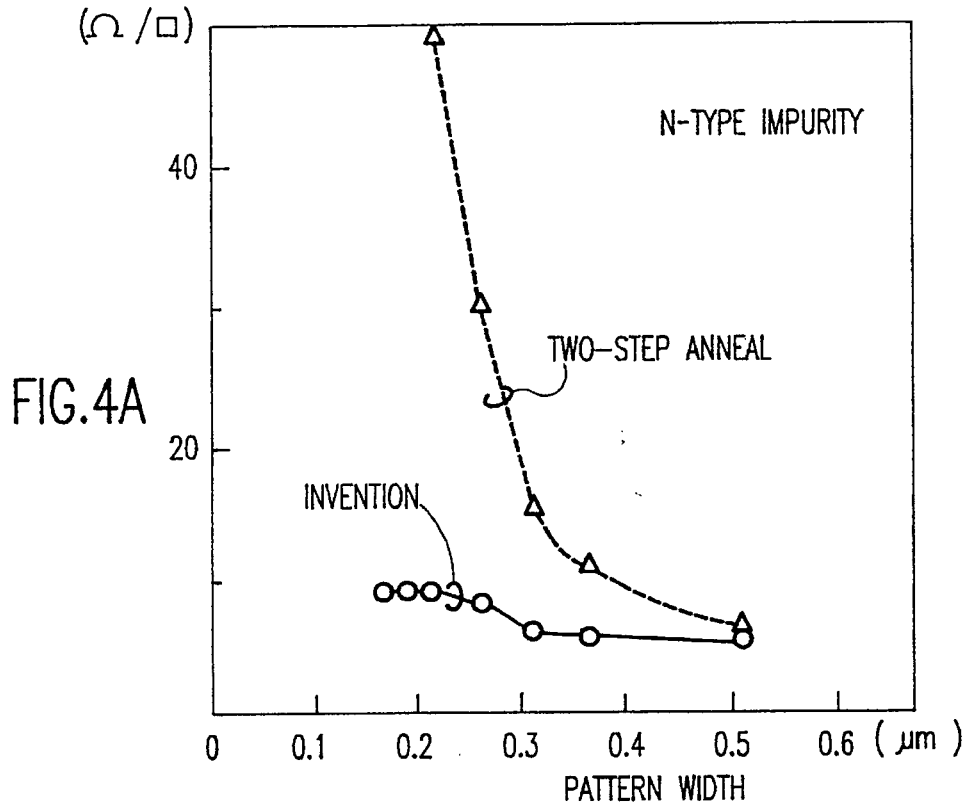
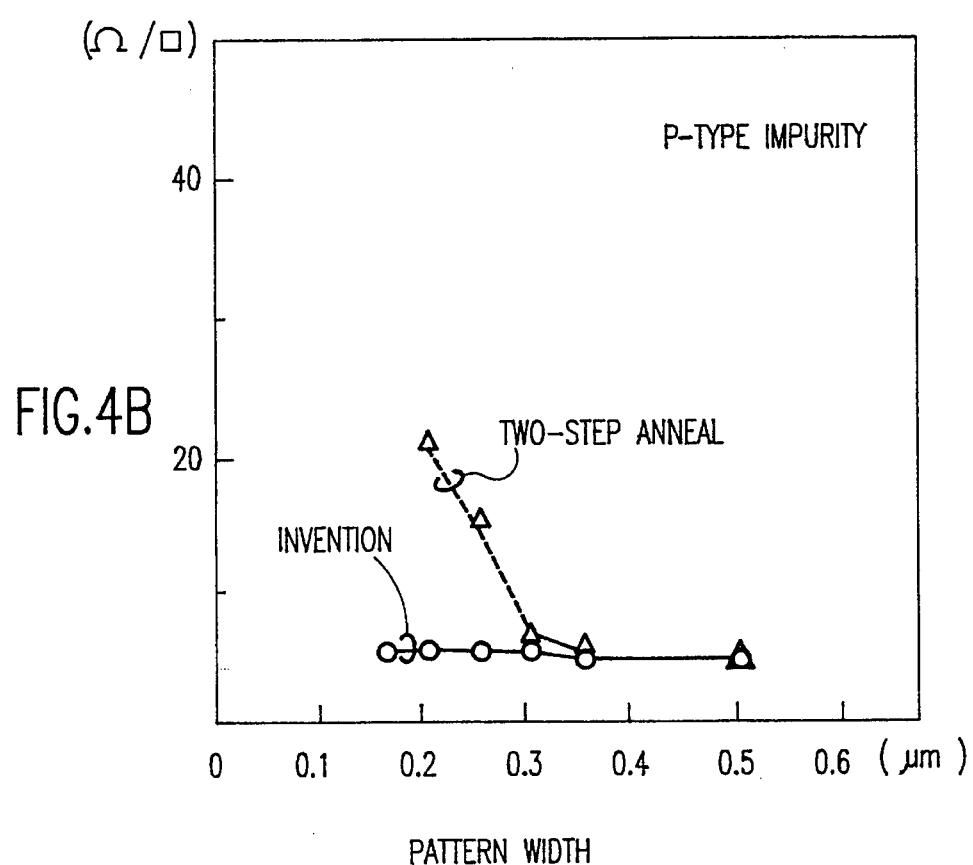

METHOD OF FABRICATING SEMICONDUCTOR DEVICE HAVING REFRACTORY METAL SILICIDE LAYER ON IMPURITY REGION USING DAMAGE IMPLANT AND SINGLE STEP ANNEAL

BACKGROUND OF THE INVENTION

The present invention relates to a method of fabricating a semiconductor device and, more particularly, to a method of forming a high melting point metal or a refractory metal silicide film.

The integration density of semiconductor circuit device has been increasing more and more in the recent years by reducing or shrinking a size of each element. The reduction in size of an element, in particular a MOS transistor, is achieved by shortening the channel length thereof.

It has been known, however, that the reduction of channel length produces the so-called short channel effect which causes a substantial reduction of threshold value of a transistor. In order to prevent the short channel effect from occurring, it is required to reduce the diffusion depth. However, when the diffusion depth is reduced, the sheet resistance of a source/drain region is increased so that the operating speed of a circuit is substantially reduced.

In order to solve this problem, therefore, it has been disclosed in Japanese Patent Application Laid-open No. Sho 57-99775 to form a silicide layer on each of a gate, a source and a drain. This technique will be described briefly with reference to FIGS. 9a to 9f.

As shown in FIG. 9a, formed-on a P type silicon substrate 101 having resistivity of 50 Ω-cm are a field oxide film 102 and a gate oxide film 103. A phosphorus doped gate polysilicon 104 is formed on the gate oxide film 103. Source/drain regions 105 and 105' and a wiring region 105" are formed by ion-injection of As with density of $1 \times 15$ cm$^{-2}$ at 40 KeV (FIG. 9b). Then, an SiO$_2$ film 106 about 300 nm thick is formed on the whole surface of the wafer by CVD method (FIG. 9c). Thereafter, the SiO$_2$ film 106 except portions thereof on side walls of the gate oxide film and the gate polysilicon is removed by an isotropic etching, so that the source/drain regions 105 and 105', the wiring region 105" and the gate polysilicon 104 are exposed (FIG. 9d).

Then, a tungsten (W) film 107 having a thickness of about 40 nm is vapor deposited on the whole surface of the wafer (FIG. 9e). Thereafter, this wafer is annealed in nitric atmosphere at, for example, 800° C. for about one hour. During this annealing, a silicide forming reaction occurs in portions 108 of the tungsten film 107 which are in contact with the silicon and a tungsten silicide (WSi$_2$) layer 109 having a thickness of about 110 nm is thus formed on substantially the whole surface of the source/drain regions 105 and 105' and the gate polysilicon 104 (FIG. 9f). Portions 110 of the tungsten film which are not reacted are they removed by treating it with acid. Thereafter, although not shown in the drawings, a PSG layer, contact holes and Al metallization, etc., are formed according to a usual fabrication method of an MOS transistor. Finally, a PSG film is provided as a protection film and bonding holes are formed, resulting in the MOS transistor. In this method, the sheet resistance of the source/drain portions is about 7 Ω/□ which is very small compared with about 50 Ω/□ of a diffusion layer, so that it is possible to reduce the depth of the source/drain diffusion layer. This technique by which a high melting point metal is deposited on a whole surface of a silicon wafer and a high melting point metal silicide is formed on only exposed surface of the silicon in self-alignment is referred to as SALICIDE (self-aligned silicide).

Other high melting point metal than tungsten, which may be used in this invention, includes molybdenum (Mo), titanium (Ti), etc.

An example of the annealing method for forming silicide by reacting a high melting point metal and silicon is disclosed in "Handotai Kenkyu 24", edited by Junichi Nishizawa/Handotai Kenkyu Shinkokai, published in 1986 by Kogyo Chosakai, p.207–239, which performs an annealing for a short time by using the lamp annealing. According to this method, it is possible to not only reduce the resistance of a film within a short time but also perform the annealing in an atmosphere whose purity is very high in view of prevention of oxidation. A relation between a sheet resistance of a titanium film 60 nm thick and an annealing temperature thereof when it is lamp-annealed in Ar atmosphere for 60 seconds is shown in FIG. 10. As will be clear from FIG. 10, the sheet resistance increases with increase of the annealing temperature up to around 575° C. since silicon in the titanium is in solid solution due to an interface reaction between titanium and silicon and the crystal phase is not formed as yet, then is abruptly decreased at around 600° C. in concomitant with a transition of silicon from solid solution phase through TiSi to TiSi$_2$ (currently, this is considered as a phase transition from solid solution through crystal phase C-49 TiSi$_2$ to crystal phase C-54 TiSi$_2$) and becomes saturated when the final TiSi$_2$ state is achieved.

According to a time dependency of the relation between sheet resistance value and annealing temperature shown in FIG. 11, the resistance value is decreased to saturation state within only 30 seconds when the thickness of the titanium film is in a range from 50 nm to 100 nm.

When this silicide technique is to be applied to a semiconductor device, it is important to prevent silicide formation on insulating films other than silicon from occurring. That is, it is possible to form silicide easily for a high melting point metal such as Pt, Pd, etc., belonging to VIIIa group, in which the metal is a diffusion seed and the formation is performed by reaction, while preventing silicide formation on an insulating film. However, when the silicide is formed by diffusion of silicon, a silicide reaction progresses toward a non-reacted metal side so long as silicon is supplied, basically, and a resultant silicide film may creep up on an edge of an oxide film as shown in FIG. 12 which shows a relation between a lamp-annealing time and a growth of silicide on the insulating film in lateral direction from the edge of the insulating film, resulting in degradation of self-alignment.

As a result, a silicide film formed on a source/drain regions creeps up along a side wall of a gate electrode and becomes in contact with a silicide film formed on the gate electrode, so that the short-circuit problem may occur between the source and the gate and between the drain and the gate. This phenomenon becomes considerable with increase of the fineness of pattern.

In order to avoid this problem, a two-step lamp-annealing method has been proposed. The two-step lamp-annealing method will be described with reference to FIGS. 13a to 13c. An oxide film is formed on a side wall of a polysilicon gate in the same manner as mentioned with reference to FIG. 9d. Then, a titanium film 107' having a thickness of 100 nm is formed in the same manner as mentioned previously (FIG. 13a). Thereafter, a resultant wafer is annealed at a relatively low temperature of about 600° C. In this case, a portion of titanium, which becomes in contact with silicon, becomes silicide, resulting in a titanium silicide layer 109'. On the other hand, a titanium film 110' on an insulating film remains in a non-reacted state due to the low annealing temperature (FIG. 13b). Thereafter, the silicon and the non-reacted high melting point metal on the insulating film are selectively removed. Succeeding thereto, a second annealing is performed at a temperature of 650° C. or more in order to reduce resistance of the silicide film and the silicide formation is completed (FIG. 13c).

FIG. 14 shows a change of sheet resistance of the silicide in the respective steps mentioned above. A titanium silicide of C-49 phase is formed by the first annealing, which is changed to a titanium silicide of C-54 phase by the second annealing, completing the silicide reaction.

The integration density of the integrated circuit has been increased and thus the size of element has been reduced correspondingly. With the reduction of element size, the film thickness and the aligning depth of diffusion layer are also made finer correspondingly. That is, with the reduction of element size, the thickness of titanium film is reduced. When the gate width becomes 300 nm or smaller and the titanium film becomes thinner, the annealing temperature in the second annealing is increased as shown in FIG. 15. With the increase of the second annealing temperature, crystal particles of $TiSi_2$ are irreversibly re-arranged by heat and the so-called aggregation reaction of the particles occurs, so that it becomes difficult to reduce the resistance. When the aggregation reaction is considerable, there is a problem of breakage of wiring. This phenomenon becomes considerable with decrease of width of wiring and electrode and a decrease of titanium film thickness. A lower limit of the second annealing temperature is defined by a temperature at which the resistance of the silicide film is reduced by the transition from TiSi to $Tisi_2$, that is, the phase transition from C-49 to C-54, and an upper limit is determined by the aggregation reaction. Particularly, when the pattern becomes as fine as having gate width of 0.3 μm or less, the applicable range of this method becomes so narrow as shown in FIG. 15 that process conditions become very severe and a stable fabrication becomes difficult and, in an extreme case, the applicable range itself may disappear.

The SALICIDE process is a process by which resistance of a source electrode, a drain electrode, a gate electrode and a polysilicon wiring is reduced and can be formed in self-alignment. Nonetheless, it has been desired to develop another process which is adaptable to further reduction of element size with increase of integration density of an integrated semiconductor circuit device.

SUMMARY OF THE INVENTION

It is therefore an object of the present invention to provide a method of fabricating a semiconductor device, which is adaptable to reduction of element size.

A method according to the present invention comprises the steps of providing a damage layer in a surface portion of a semiconductor region, depositing on the damage layer a high-melting-point (refractory) metal film having thickness not smaller than four tenths of a thickness of the damage layer and not larger than the thickness of the damage layer, and heat-treating to form a silicide layer.

The metal film may be a single film, a laminated film or a mixed film of a high-melting-point metal selected from a group consisting of elements belonging to IVb, Vb and VIb groups. Further, the same effect is obtainable when the metal film is a lamination of a film of a high melting point metal selected from selected from a group consisting of elements belonging to IVb, Vb and VIb groups and a film of another high melting point metal selected from the group consisting of elements belonging to IVb, Vb and VIb groups or a mixed film of the high melting point metal and the another high melting point metal.

Further, in a case where the high melting point metal contains nitrogen, the same effect can be obtained by performing the heat treatment in not nitric but an inert gas atmosphere. In such a case, the high melting point metal film is a single film, a laminated film from or a mixed film of a high melting point metal selected from a group consisting of elements belonging to IVb, Vb and VIb groups. Further, the same effect can be obtained by using the high melting point metal film which is a lamination of or a mixed film of a film of a high melting point metal selected from a group consisting of elements belonging to IVb, Vb and VIb groups and a film of another high melting point metal selected from the group consisting of elements belonging to IVb, Vb and VIb groups.

The heat-treatment is preferably performed at a temperature not lower than 750° C. for a period not longer than 60 seconds.

BRIEF DESCRIPTION OF THE DRAWINGS

The above and other objects, features and advantages of the present invention will be more apparent from the following description taken in conjunction with the accompanying drawings, in which:

FIGS. 4a and 4b are graphs showing a relation between a pattern width and a sheet resistance;

DETAILED DESCRIPTION OF THE PREFERRED EMBODIMENTS

Figure 1A:
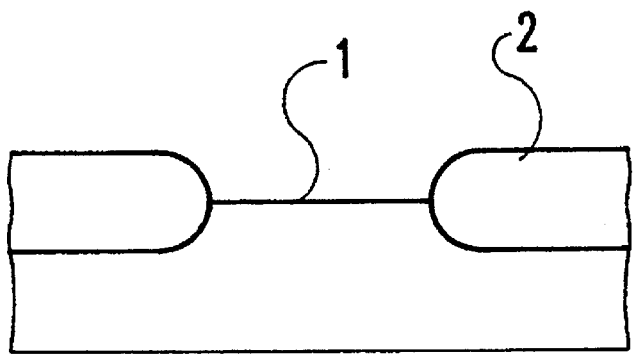
FIGS. 1a to 1d are cross-sectional views illustrative of respective fabrication steps according to an embodiment of the present invention.

Referring now to FIGS. 1a to 1d illustrative of a method according to an embodiment of the present invention, a field oxide film 2 is selectively formed on a P type silicon substrate 1 having a specific resistivity of 15 Ω·cm, through the well-known selective oxidization process. In this case, an area of the silicon substrate 1 which is defined by the field oxide film 2 is 250 nm wide and 0.2 mm long (FIG. 1a).

Figure 1B:
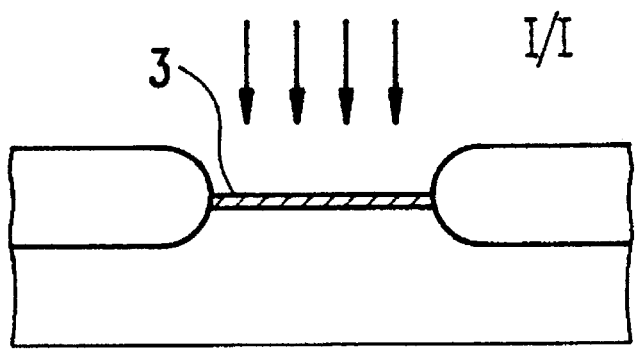

Then, by ion implantation, silicon ions are implanted under conditions of acceleration energy of 20 KeV and density of $4 \times 10^{14}$ cm$^{-2}$ to form a damage layer 3. If desired, other ions such germanium, phosphor, arsenic, antimony and boron may be employed. It is to be noted that if a region on which a silicide layer is to be formed is of an N-type, phosphorous, arsenic or antimony ions are employed. In the case of a P-type, on the other hand, boron is employed. Silicon or germanium ions can be employed for both N-type and P-type regions. The damage layer 3 has a depth of about 30 nm measured from a surface of the silicon substrate 1 (FIG. 1b). It is to be noted that such an annealing process that recovers the damage layer 3 is not carried out until the next step is performed.

Figure 1C:
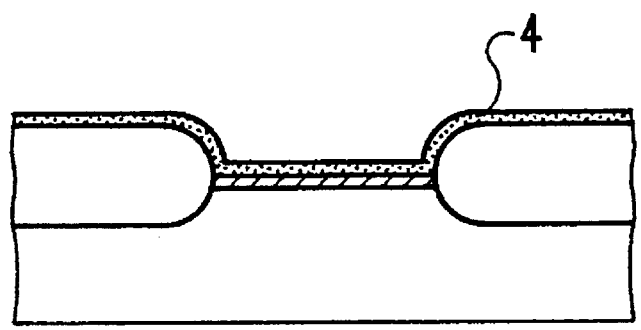

Then, a titanium film 4 having thickness of 30 nm is deposited on the whole surface of the silicon substrate by usual sputtering (FIG. 1c).

Figure 1D:
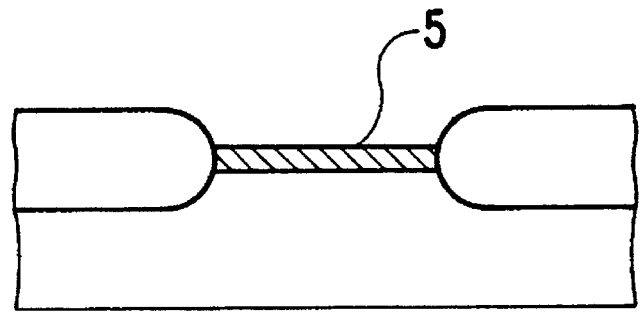

Thereafter, a halogen lamp annealing is performed in nitric atmosphere for 10 seconds to react silicon with titanium to thereby form a titanium silicide layer 5. Then, a portion of the titanium film, which is on the field oxide film and not reacted with silicon, is removed by usual wet-etching (FIG. 1d).

Figure 2:
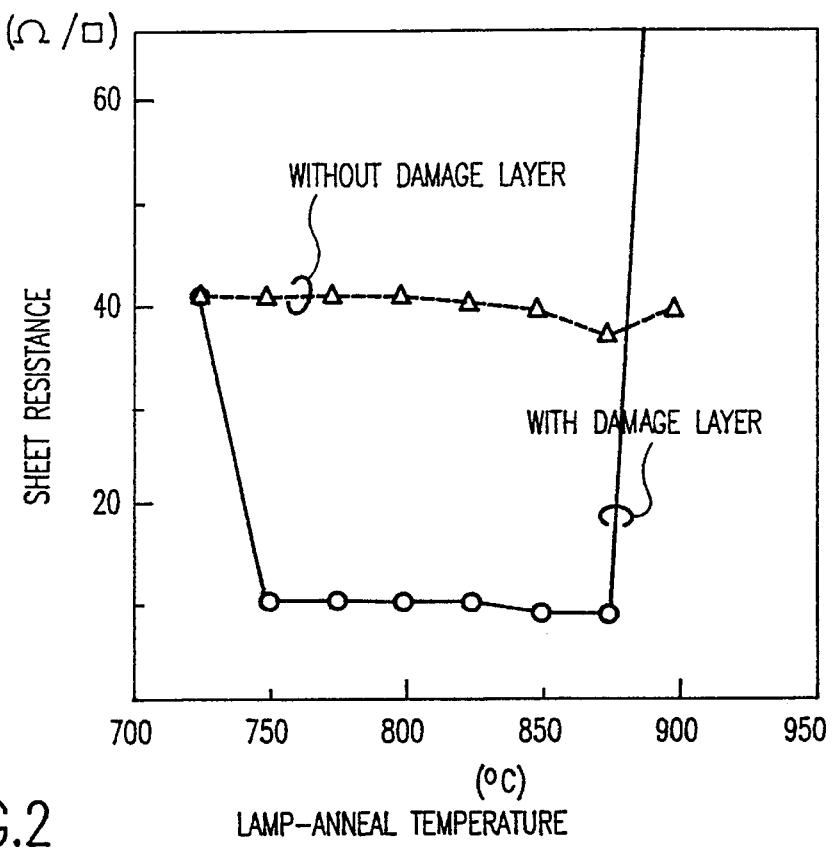
FIG. 2 is a graph showing a relation between a lamp-annealing temperature and a sheet resistance.

As shown in FIG. 2, if there is no damage layer in the silicon substrate 1, the sheet resistance of the titanium silicide layer is substantially constantly about 400 Ω/□ even when the halogen lamp annealing temperature is changed from 700° C. to 900° C. This is because titanium is substantially not reacted with silicon. On the other hand, the method according to the present embodiment forms the damage layer in the silicon substrate 1, and hence the sheet resistance is reduced to about 10 Ω/□ in the temperature range from about 750° C. to about 900° C. When the annealing temperature exceeds the above temperature range, however, the sheet resistance increases sharply due to the aggregation reaction of the titanium silicide layer 5. When the temperature is lower than the above temperature range, the sheet resistance can not be reduced enough.

Figure 3:
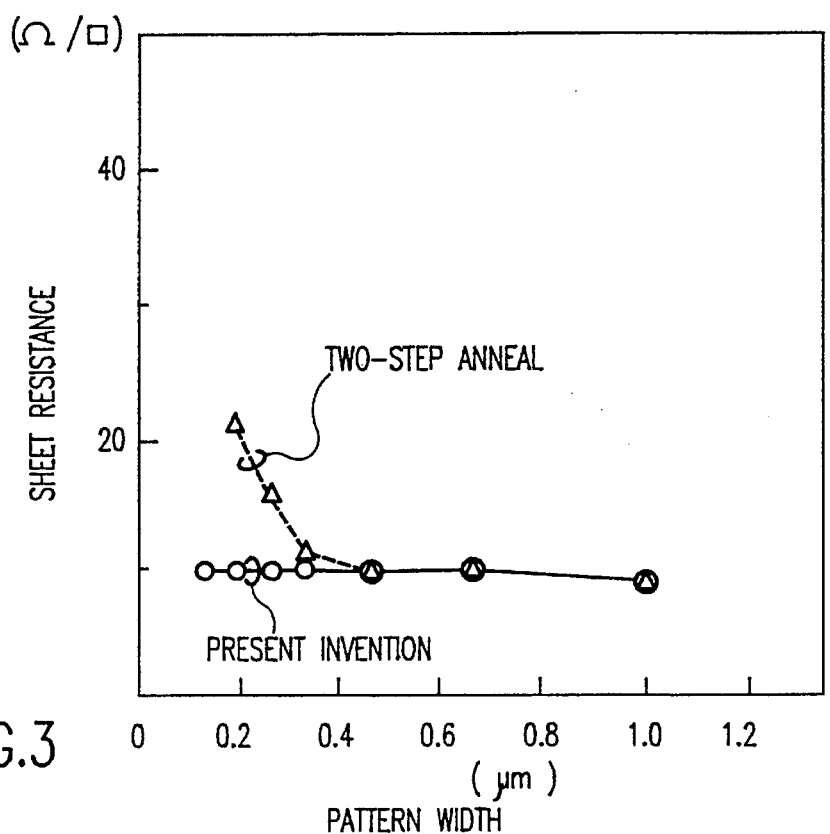
FIG. 3 is a graph showing a relation between a pattern width and a sheet resistance.

Also in comparison between the present embodiment method and the two-step annealing method shown in FIG. 3, as shown in FIG. 3, the sheet resistance of the titanium silicide film formed by using the two-step annealing method increases when the width of the titanium silicide layer is 300 nm or smaller. On the other hand, the sheet resistance of the titanium silicide film 5 prepared according to the present method is substantially constant even if its width becomes narrower than 300 nm.

FIGS. 4a and 4b are graphs showing a relation between a pattern width and a sheet resistance when arsenic is introduced in the silicon substrate at a density of $1 \times 20$ cm$^3$ as N type impurity and when boron is introduced in the silicon substrate at density of $1 \times 20$/cm$^3$ as P type impurity, respectively. As is clear from FIGS. 4a and 4b, the sheet resistance of the titanium silicide film prepared according to the present invention does not increase even if its width is narrower than 300 nm. Although the result shown is for the silicon substrate, the same effect is obtainable for polysilicon.

Figure 5:
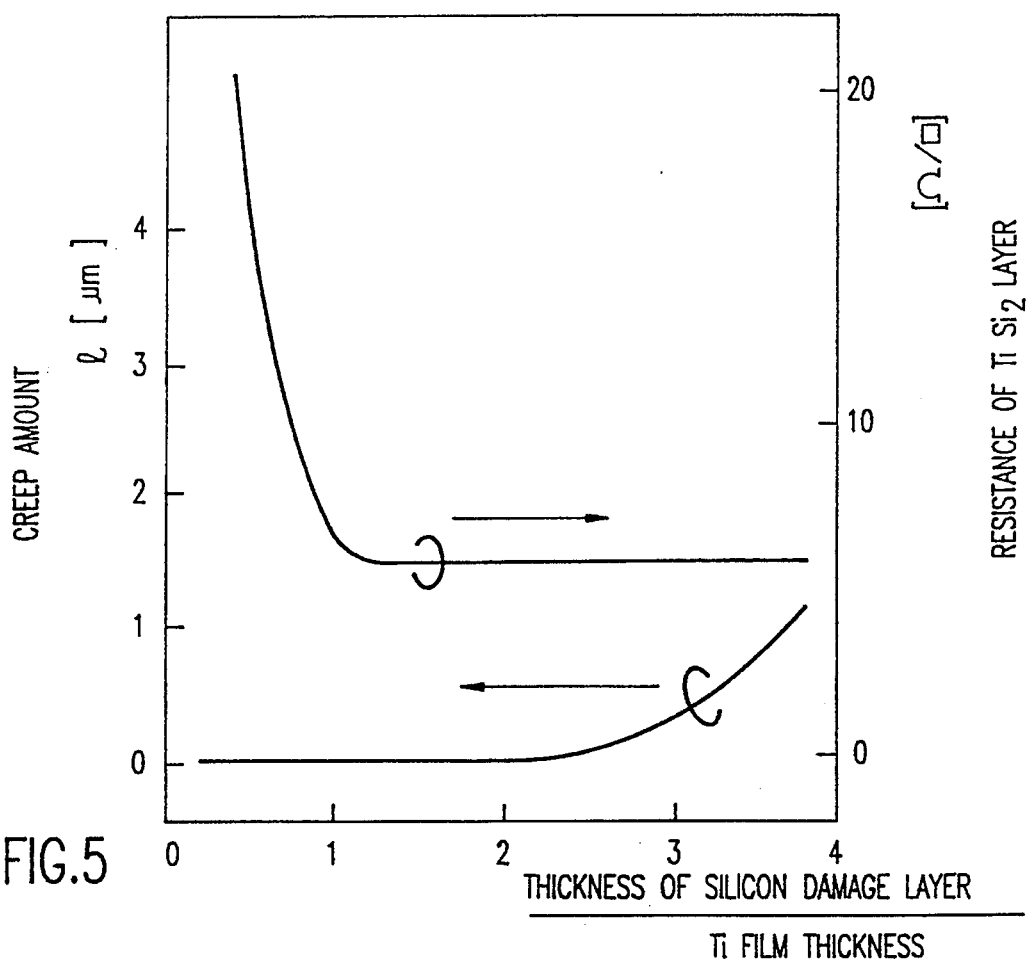
FIG. 5 is a graph showing a relation between a thickness of a damage layer and a creep-up amount.

FIG. 5 is a graph showing a relation between a thickness of the damage layer and a creep up amount of titanium silicide layer onto the insulating film as well as a sheet resistance of the titanium silicide layer. As is clear from FIG. 5, the sheet resistance of the titanium silicide layer increases when the thickness of the damage layer is smaller than the titanium silicide film thickness. The reason for this is considered that the speed of reaction between the high melting point metal and silicon is high in the damage layer while it is low in the silicon layer having no damage layer. It is also clear from FIG. 5 that, when the thickness of the damage layer becomes 2.5 times as large as the thickness of the titanium silicide film or more, the titanium silicide layer is crept up and moves onto the insulating film. The reason for this is considered that the amount of silicon reacting with titanium becomes too large in the damage layer.

Figure 6:
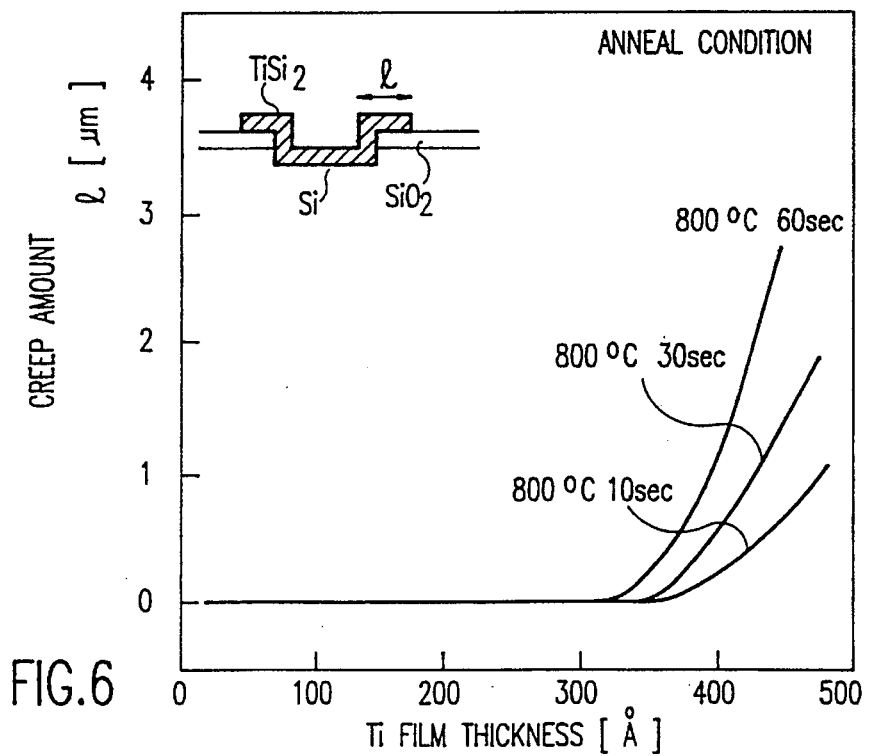
FIG. 6 is a graph showing a relation between a thickness of a titanium film and a creep-up amount.
Figure 7:
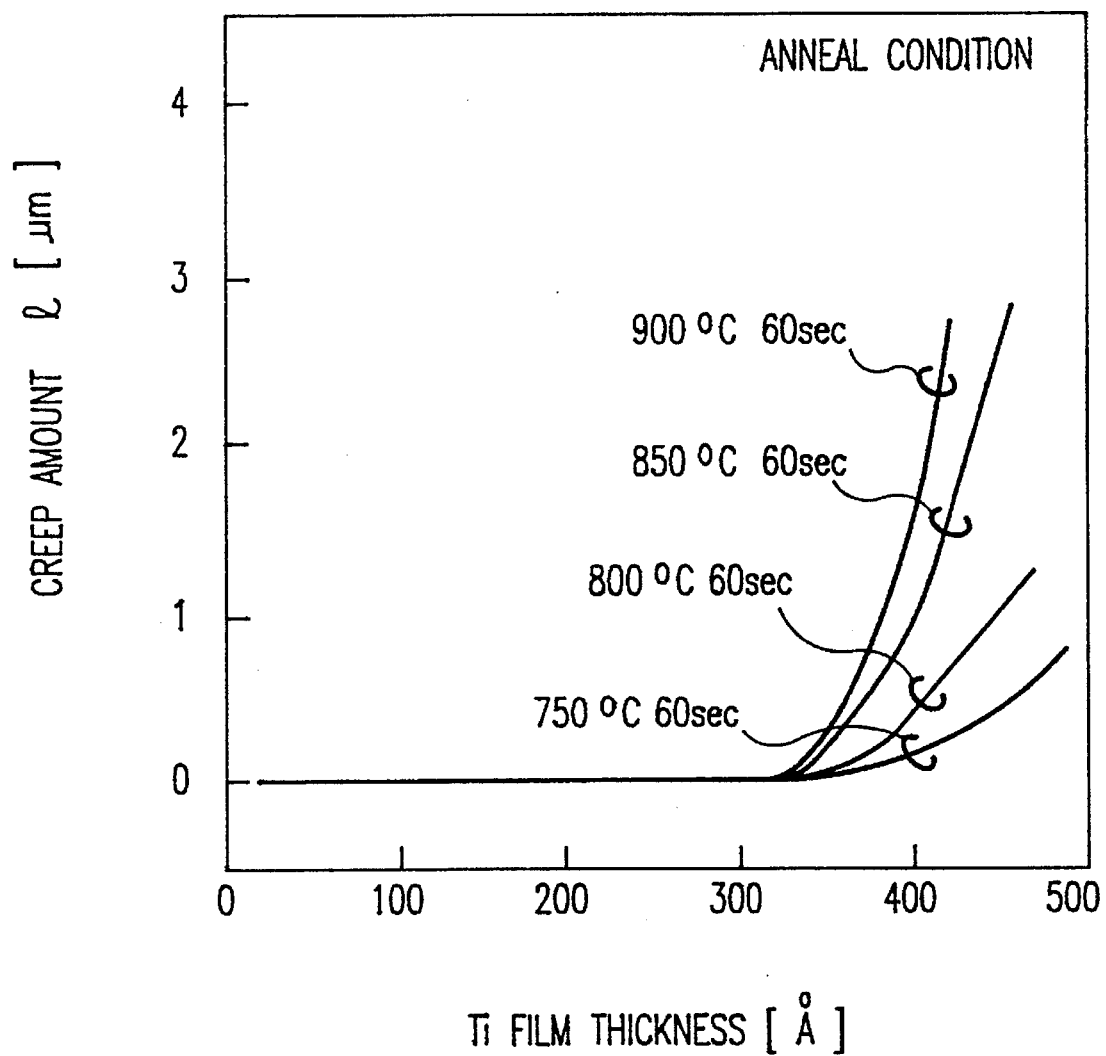
FIG. 7 is a graph showing a relation between a thickness of a titanium film and a creeping amount.

FIGS. 6 and 7 show a relation between a thickness of a titanium film and a creep-up amount of the titanium silicide film onto the insulating film with annealing temperature being a parameter. From these figures, it is clear that, when the thickness of the titanium film exceeds 30 nm, the titanium silicide film creeps up on the insulating film regardless of annealing temperature.

Although the damage layer is formed by ion-implantation of silicon, other material such as arsenic, phosphor, boron fluoride or germanium, etc., may be ion-injected to form a damage layer on a surface of a polysilicon substrate.

Although, in this embodiment, the titanium film is deposited on the substrate by sputtering, the same effect can be obtained by using a lamination of a layer of a high melting point metal belonging to IVb, Vb or VIb group and another layer of another melting point metal or a mixture layer of a high melting point metal belonging to IVb, Vb or VIb group and another high melting point metal (for example, a mixture layer of titanium 95% and cobalt 5%). Further, when a titanium film containing nitrogen in a ratio of 1 to 10% or a film of a high melting point metal belonging to IVb, Vb or VIb group is deposited, the same effect can be obtained by annealing it in not nitric atmosphere but another inert gas atmosphere. When nitrogen in the high melting point metal film is 1% or less, the silicide reaction between silicon and the high melting point metal is not restricted by nitrogen and the silicide film creeps up on the insulating film and, when it is 10% or more, the sheet resistance is increased.

Figure 8A:
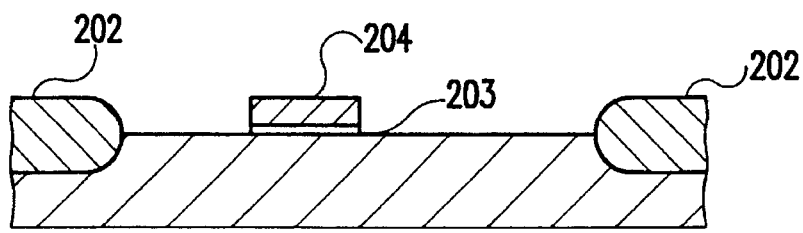
FIGS. 8a to 8g show fabrication steps according to another embodiment of the present invention.
Figure 8B:
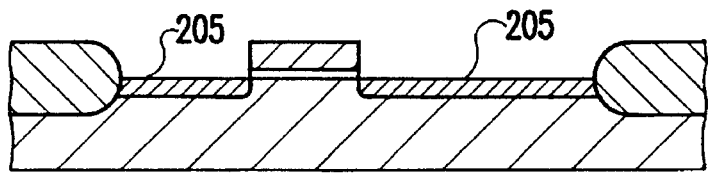

Referring to FIGS. 8a to 8b illustrative of a method according to another embodiment of the present invention, a field oxide film 202, a gate oxide film 203 and a non-doped polysilicon gate electrode 204 having a thickness of 150 nm are formed on a P type silicon substrate 201 having a specific resistance of 15 Ω·cm through the conventional fabrication steps, as shown in FIG. 8a. Then, impurity ions such as arsenic are ion-implanted under conditions of acceleration energy of 40 KeV and density of $1 \times 10^{14}$ cm$^{-2}$, followed by annealing at 900° C. for 20 minutes. Lightly-doped source/drain diffusion layers 205 are thereby formed, as shown in FIG. 8b. The polysilicon gate 204 is also doped with the impurities.

Figure 8C:
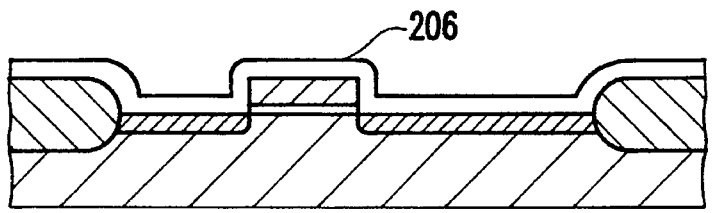
Figure 8D:
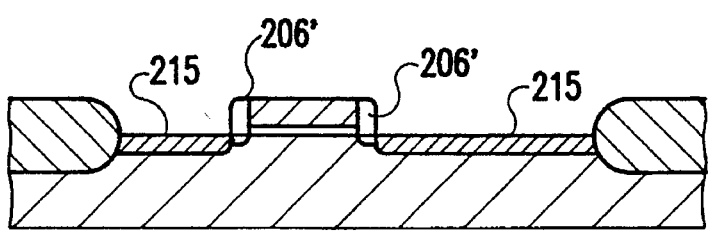

Then, a silicon oxide film 206 having a thickness of about 300 nm is formed on a whole surface by the CVD method (FIG. 8c). Then, the oxide film 206 is subjected to the anisotropic etching to thereby form side wall spacers 206'. Then, arsenic ions are ion-implanted again under conditions of acceleration energy of 70 KeV and density of $3 \times 10^{15}$ cm$^{-2}$, and thereafter an annealing process is peformed at a heat treatment at 900° C. for 20 minutes. Consequently, highly-doped second source/drain layers 215 are formed, as shown in FIG. 8d. At this time, the arsenic impurities are further introduced into the gate polysilicon electrode 204.

Figure 8E:
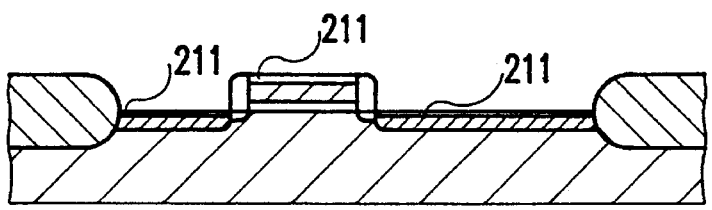

Then, silicon is ion-implanted into the highly-doped source/drain regions 215 and further into the polysilicon gate layer 204 to form damage layers 211 each having a thickness of about 30 nm (FIG. 8e).

Figure 8F:
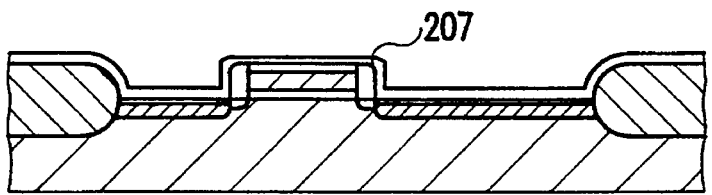

Thereafter, a titanium film 207 having a thickness of 30 nm is deposited on the whole surface of the wafer by the sputtering method (FIG. 8f).

Figure 8G:
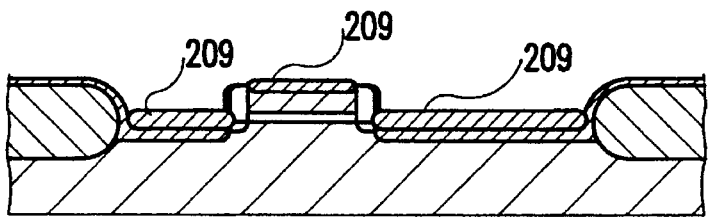
Figure 9A:
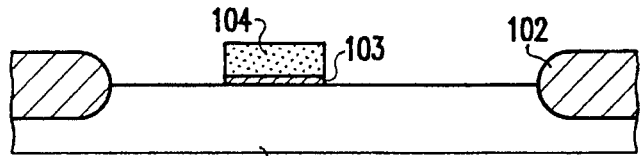
FIGS. 9a to 9f show fabrication steps of a prior art method.
Figure 9B:
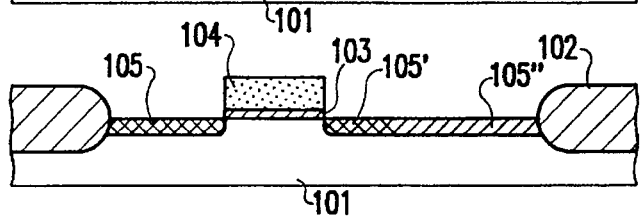
Figure 9C:
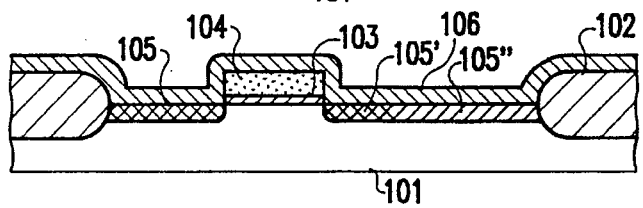
Figure 9D:
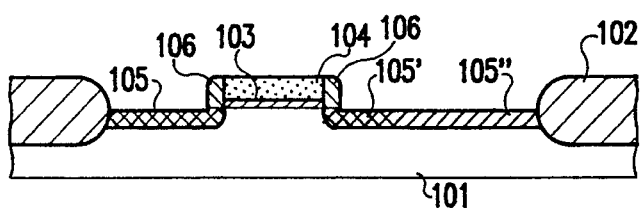
Figure 9E:
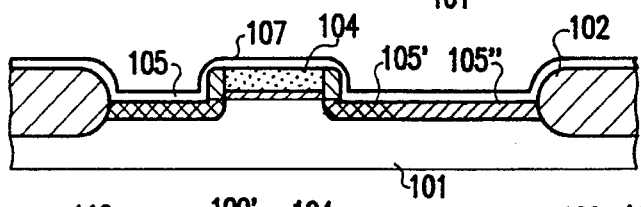
Figure 9F:
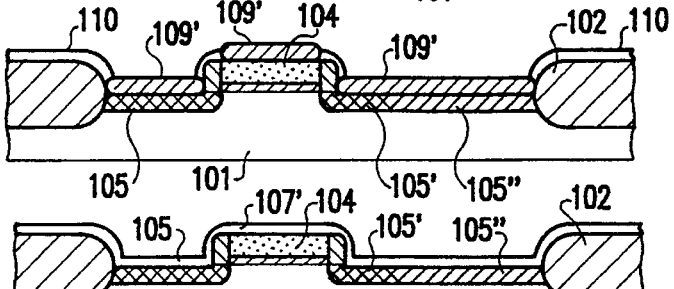
Figure 13A:
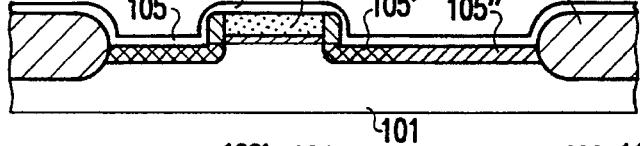
FIGS. 13a to 13c show fabrication steps of another prior art method.
Figure 13B:
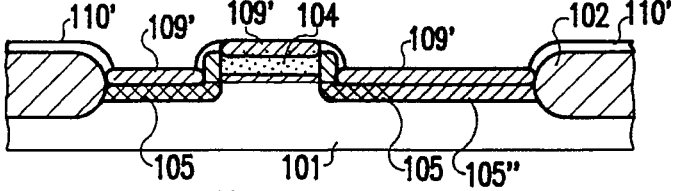
Figure 13C:
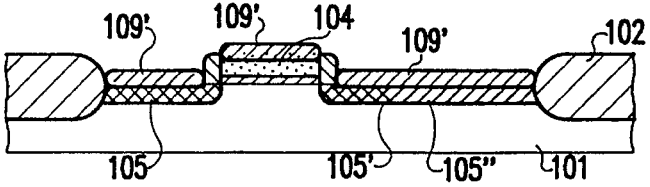
Figure 10:
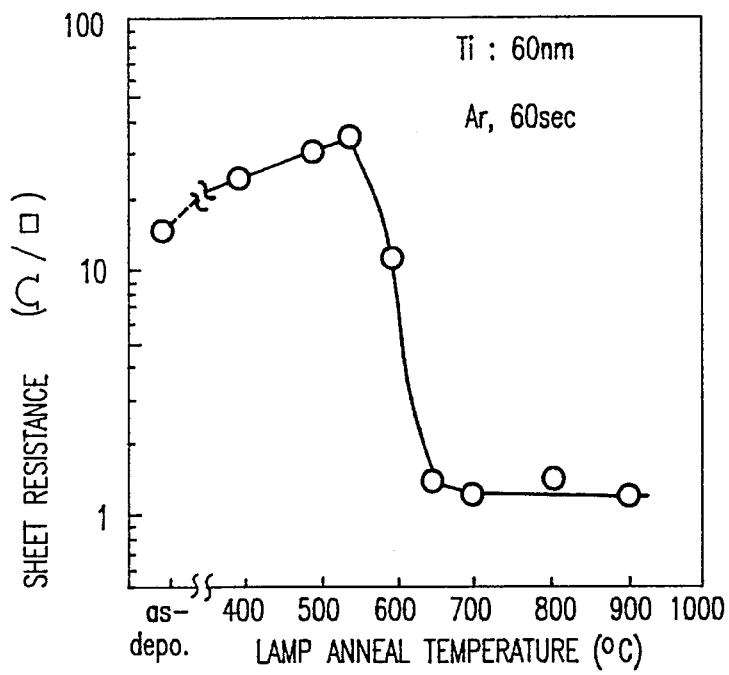
FIG. 10 is a graph showing a relation between an annealing temperature and a sheet resistance.
Figure 11:
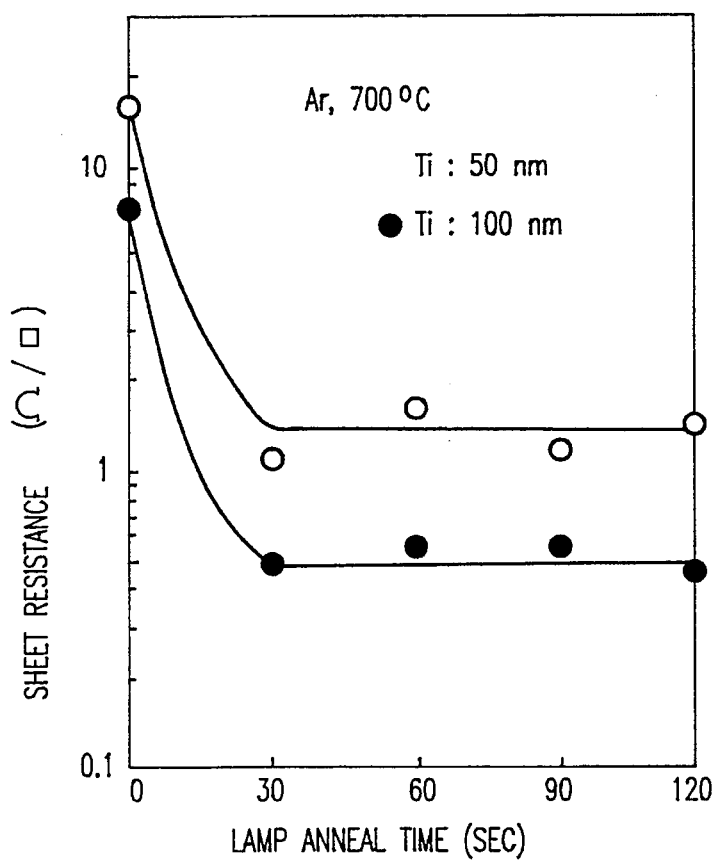
FIG. 11 is a graph showing annealing temperature dependency of sheet resistance.
Figure 12:
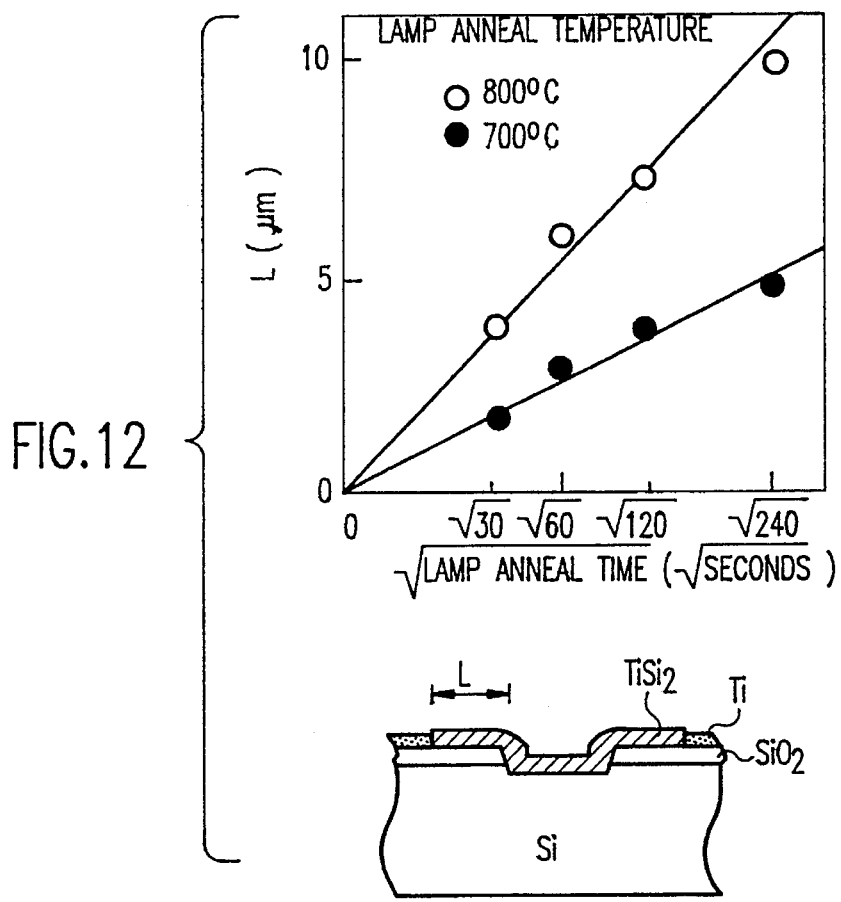
FIG. 12 shows a relation between an annealing time and a growth of silicide film in lateral direction.
Figure 14:
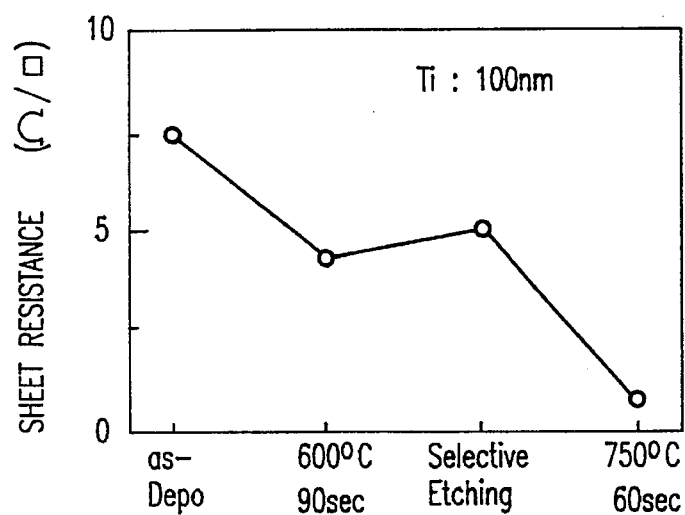
FIG. 14 is a graph showing a relation between an annealing temperature and a sheet resistance.
Figure 15:
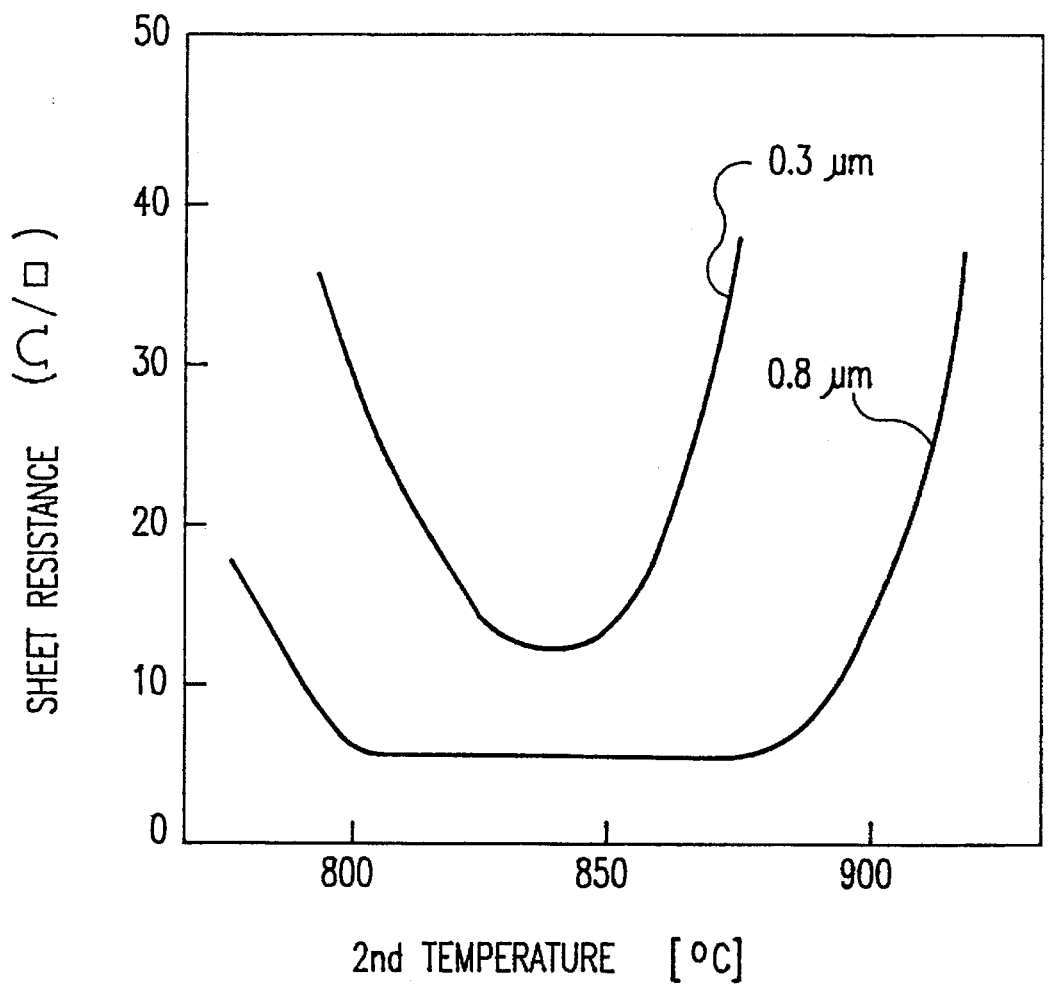
FIG. 15 is a graph showing a change of sheet resistance in two-step annealing.

Then, the wafer is annealed by using a halogen lamp in a nitric atmosphere at 850° C. for 10 seconds to form titanium silicide layers 209 by reacting the respective portions of the titanium film 207 with the corresponding portions of the source/drain regions 215 and the polysilicon gate 204, as shown in FIG. 8g.

Thereafter, portions of the titanium film 210 which are not reacted with silicon are removed by wet etching. Subsequently, although not shown, an interlayer insulating film, contact holes, wiring, etc., are formed by the conventional steps. Thus, the so-called lightly-doped drain (LDD) MOS transistor is fabricated.

Although the embodiment of the present invention has been described for fabrication of a LDD type N channel MOS field effect transistor, it should be noted that the present invention can be applied to fabrication of a P channel MOS field effect transistor, a CMOS type integrated circuit, a bipolar transistor integrated circuit or a Bi-CMOS integrated circuit as well.

As described hereinbefore, according to the present invention, it is possible to form a low resistance silicide without aggregation reaction and creeping-up of a silicide film onto a surface of an insulating film even when the width of element or wiring is 300 nm or less. This is because the silicide creeping problem in the one-step annealing method is solved by forming a damage layer in a silicon substrate surface prior to deposition of a high melting point metal film having a thickness of 30 nm or less and annealing the wafer in nitric atmosphere. That is, when titanium is annealed in a nitric atmosphere without a damage layer, a reaction between titanium and nitrogen occurs at high speed and titanium nitride is formed before the silicide reaction between titanium and silicon progresses. On the contrary, when there is a damage layer in the silicon surface, the activity of silicon in the damage layer and hence the speed of the reaction between titanium and silicon becomes high, contributing to the silicide reaction effectively.

Further, when an impurity is introduced in a silicon layer in the two-step annealing method, the sheet resistance of a silicide layer formed on a silicon layer containing N type impurity becomes higher than that of a silicide layer formed on a silicon layer containing P type impurity, which is a problem in fabricating a CMOS semiconductor device. According to the present invention, a CMOS semiconductor device having balanced drain and source resistance of N and P channels can be obtained.

It is apparent that the present invention is not limited to the above embodiments but may be changed and modified without departing from the scope and spirit of the invention.

What is claimed is:

1. A method of fabricating a semiconductor device comprising steps of:

implanting ions selected from a group of silicon, germanium, phosphor, arsenic, antimony and boron in a surface portion of a semiconductor region to form an ion-implanted portion at said surface portion of said semiconductor region;

depositing on said ion-implanted portion a refractory metal film having thickness that is not smaller than four tenths of a thickness of said ion-implanted portion and not larger than the thickness of said ion-implanted portion; and performing a one-step annealing process in which annealing for reacting said refractory metal film with said ion-implanted portion is performed once.

2. The method as claimed in claim 1, wherein said metal film is made of a metal selected from a group consisting of elements belonging to columns IVb, Vb and VIb of the periodic table.

3. The method as claimed in claim 1, wherein said one-step annealing process is performed in a nitric atmosphere.

4. The method as claimed in claim 1, wherein said one-step annealing process is performed in an inert gas atmosphere.

5. The method as claimed in claim 4, wherein said one-step annealing process is performed at a temperature not lower than 750° C. for a period not longer than 60 seconds.

6. A method of fabricating a semiconductor device comprising steps of:

forming a gate electrode on a gate insulating film covering a semiconductor substrate;

doping impurities into said semiconductor substrate by using said gate electrode as a mask to thereby form first source and drain regions;

forming side wall spacers on side surfaces of said gate electrode;

doping impurities into said first source and drain regions by using said side wall spacers as a mask to thereby form second source and drain regions having an impurity concentration higher than said first source and drain regions in contact with said first source and drain regions;

implanting ions selected from a group of silicon, germanium, phosphor, arsenic, antimony and boron in a surface portion of each of said second source and drain regions to form an ion-implanted portion at said surface portion of each of said second source and drain regions;

depositing a refractory metal layer on said ion-implanted portion of each of said second source and drain regions with a thickness in a range of four tenths of a thickness of said ion-implanted portion to one time the thickness of said ion-implanted portion; and reacting said refractory metal layer with said ion-implanted portion by a one-step annealing in which annealing for reacting is performed once.

7. The method as claimed in claim 6, wherein each of said second source and drain regions is of an N-type and said ion-implanted portion is formed by ion-implanting one of silicon, germanium, arsenic, phosphor, and antimony.

8. The method as claimed in claim 6, wherein each of said second source and drain regions is of a P-type and said ion-implanted portion is formed by ion-implanting one of silicon, germanium and boron.

9. A method of fabricating a semiconductor device comprising steps of:

forming a polysilicon gate on a gate insulating film covering a silicon substrate;

selectively doping impurities into said silicon substrate to form source and drain regions;

implanting ions selected from a group of silicon, germanium, phosphor, arsenic, antimony and boron to form an ion-implanted portion in each of said polysilicon gate and said source and drain regions, said ion-implanted region having a first thickness;

depositing a refractory metal on said ion-implanted portion of each of said polysilicon gate and said source and drain regions with a second thickness that is in a range of four tenths of said first thickness to one time said first thickness; and reacting said refractory metal with silicon in said polysilicon gate and said source and drain regions by a one-step annealing in which annealing for reacting is performed once, said ion-implanted portion of each of said polysilicon gate and said source and drain regions being thereby converted into a refractory metal silicide layer.

10. The method as claimed in claim 1, wherein said one-step annealing process is performed at a temperature in a range of 750°–900° C.

11. The method as claimed in claim 10, wherein a sheet resistance of said refractory metal film having been reacted with said ion-implanted portion, is substantially constant within the range of 750°–900° C.

12. The method as claimed in claim 10, wherein a sheet resistance of said refractory metal film having been reacted with said ion-implanted portion, is about 10 Ω/□ the range of 750°–900° C.

13. The method as claimed in claim 10, further comprising a step of providing said refractory metal film having been reacted with said ion-implanted portion, with a width of less than 300 nm, wherein a sheet resistance of said refractory metal film having been reacted with said ion-implanted portion is substantially constant within the range of 750°–900° C.

14. The method as claimed in claim 6, wherein said one-step annealing process is performed at a temperature in a range of 750°–900° C.

15. The method as claimed in claim 14, wherein a sheet resistance of said refractory metal layer having been reacted with said ion-implanted portion, is substantially constant within the range of 750°–900° C.

16. The method as claimed in claim 14, wherein a sheet resistance of said refractory metal layer having been reacted with said ion-implanted portion, is about 10 Ω/□ at the range of 750°–900° C.

17. The method as claimed in claim 14, further comprising a step of providing said refractory metal layer having been reacted with said ion-implanted portion, with a width of less than 300 nm, wherein a sheet resistance of said refractory metal layer having been reacted with said ion-implanted portion is substantially constant within the range of 750°–900° C.

18. The method as claimed in claim 9, wherein said one-step annealing process is performed at a temperature in a range of 750°–900° C.

19. The method as claimed in claim 18, wherein a sheet resistance of said refractory metal silicide layer is about 10 Ω/□ within the range of 750°–900° C.

20. The method as claimed in claim 18, further comprising a step of providing said refractory metal silicide layer with a width of less than 300 nm, wherein a sheet resistance of said refractory metal silicide layer is substantially constant within the range of 750°–900° C.

* * * * *

UNITED STATES PATENT AND TRADEMARK OFFICE
Certificate

Patent No. 5,593,823                                         Patented: January 14, 1997

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Susan Wollowitz, Lafayette, CA (US); Stephen T. Isaacs, Orinda, CA (US); Henry Rapoport, Berkeley, CA (US); and Hans P. Spielmann, Lexington, KY (US).

Signed and Sealed this Tenth Day of December 2013.

MICHAEL G. WITYSHYN
*Supervisory Patent Examiner*
Art Unit 1651
Technology Center 1600